（12）United States Patent
Sheats

(10) Patent No.: US 6,967,115 B1
(45) Date of Patent: Nov. 22, 2005

(54) DEVICE TRANSFER TECHNIQUES FOR THIN FILM OPTOELECTRONIC DEVICES

(75) Inventor: James R. Sheats, Palo Alto, CA (US)

(73) Assignee: Nanosolor, Inc., Palo Alto, CA (US)

( * ) Notice: Subject to any disclaimer, the term of this patent is extended or adjusted under 35 U.S.C. 154(b) by 0 days.

(21) Appl. No.: 10/828,109

(22) Filed: Apr. 20, 2004

(51) Int. Cl.[7] ............................................. H01L 21/00
(52) U.S. Cl. ......................................... 438/22; 438/957
(58) Field of Search ............................... 438/22, 64, 97, 438/98, 125, 145, 957, 977

(56) References Cited

U.S. PATENT DOCUMENTS 5,665,607 A * 9/1997 Kawama et al. ............... 438/64
6,716,080 B2 * 4/2004 Hoffman et al. .............. 445/24

OTHER PUBLICATIONS

D. Rudman et al. "Development of Flexible Cu(In,Ga)Se2 Solar Cells on polymers with Lift-Off Processes"; in 16th European Photovoltaic Solar Energy Conference and Exhibition, Glasgow, United Kingdom, May 1-5, 2000.
R.E.I. Schropp, et al., "Novel Amorphous Silicon Solar Cell Using a Manufacturing Procedure with a Temporary Superstrate ", Materials Research Society Proceedings, vol. 557, p. 713 (1999).
A. Yializis and D.A. Markgraf "Atmospheric Plasma: The New Functional Treatment For Films" in *Paper, Film and Foil Converter*, Feb. 1, 2001.
W. Kern and J. Vossen, *Thin Film Processes*, Academic Press: New York, 1978, Ch V-1, pp 401-496.
U.S. Appl. No. 10/403,997, entitled "Improved Transparent Electrode, Optoelectronic Apparatus and Devices" filed Mar. 29, 2003.
"Plasma Chemical Vapor Deposition of Dielectric Thin Films for ULSI Semiconductor Circuits"; by A. K. Stamper, D. S. Armbrust, D. Tobben, R. A. Conti and G. Y. Lee; from IBM J. Res. Develop., vol. 43, p 5-38 (selected portions) (1999).

* cited by examiner

*Primary Examiner*—Phuc T. Dang
(74) *Attorney, Agent, or Firm*—JDI Patent; Joshua D. Isenberg

(57) ABSTRACT

A method for fabricating optoelectronic devices is disclosed. A sacrificial layer is deposited, formed or attached to a target substrate having a plurality of through holes. One or more device layers are formed on the sacrificial layer and the sacrificial layer is exposed to an etchant through the holes in the target substrate to detach the target substrate from the sacrificial layer without destroying the target substrate.

26 Claims, 4 Drawing Sheets

DEVICE TRANSFER TECHNIQUES FOR THIN FILM OPTOELECTRONIC DEVICES

FIELD OF THE INVENTION

Embodiments of the present invention are directed to fabrication of optoelectronic devices and more specifically to fabricating optoelectronic devices on a reusable substrate.

BACKGROUND OF THE INVENTION

Optoelectronic devices interact with radiation and electric current. The interaction can be photoelectric where the device converts incident radiant energy (e.g., in the form of photons) into electrical energy. Alternatively Optoelectronic devices often tend to be high voltage and low current devices. Currently many optoelectronic devices, e.g., thin-film photovoltaic (PV) cells and organic light-emitting diodes (OLEDs) are made by depositing patterns of material on a substrate to form the various device layers, e.g., a bottom electrode, an active layer stack and a top electrode (plus auxiliary layers), of individual devices. In order to reduce the cost of thin film optoelectronic devices, such as solar cells, the use of inexpensive substrate materials is important. Cost goals for competitively priced PV energy products dictate materials costs in the range of $25–$50/m$^2$.

Commodity plastics commonly used in web converting operations cost a small fraction of that; an example is poly(ethylene terephthalate), or PET, which is available at about $0.22/m$^2$ for a 1 mil (25 micron) thickness (2–4 mils would be preferred for mechanical strength). On the other hand, PET cannot withstand temperatures such as are required for many desired thin film process steps, especially those used in the manufacture of CIGS (CuInGaSe$_2$) solar cells, which must be processed at 400–500° C. for times in the range of ½ to 1 hour or more.

Polyimides (PI) are well-known materials also used in web processing (for some kinds of flexible circuit tapes, for example) which can withstand these temperatures. Several research groups have, in fact, used polyimides to make flexible CIGS PV cells. The price of polyimides is much higher than PET, however; currently around $8–$10m$^2$ for 2 mil thickness. This is a very substantial cost, and represents a significant impediment to successful commercialization. Polyimides also have some undesirable properties when used at these temperatures; although they do not decompose, the thermal expansion induces stresses that may be problematic for film adhesion, and water absorption and outgassing in vacuum is an issue. Thin metal foils eliminate concerns about thermal stability or mechanical deformation, but they have other problems. Such foils are not sufficiently smooth as received from commercial sources, and must be polished by means which are not well developed and which add cost. Metals are also more expensive than desired. Estimates for stainless steel range for $4/m$^2$ to over $12/m$^2$. Aluminum is cheaper, but may need to be thicker to have adequate strength for processing.

It would be desirable to use a transfer process in which photovoltaic (PV) devices are fabricated on one substrate optimized for fabrication conditions and transferred to another optimized for the final product. Such transfer process have been proposed and demonstrated already several times, both for PV application and for thin film transistors. For example, D. Rudmann, et al., "Development of Flexible Cu(In,Ga)Se$_2$ Solar Cells on polymers with Lift-Off Processes"; in 16th European Photovoltaic Solar Energy Conference and Exhibition, Glasgow, United Kingdon, 1–5 May 2000, have demonstrated the use of NaCl as a sacrificial layer allowing the detachment of CIGS solar cells from a glass fabrication substrate. R. E. I. Schropp, et al., "Novel Amorphous Silicon Solar Cell Using a Manufacturing Procedure with a Temporary Superstrate", Materials Research Society Proceedings, vol. 557, p. 713 (1999) describe the fabrication of amorphous silicon solar cells on an aluminum substrate (or "superstrate"), after which a polymer is laminated on top and the metal etched away.

Unfortunately, these prior art processes suffer from several disadvantages. If the metal has to be removed by etching, there is nothing to be gained from the cost viewpoint compared to leaving it in place. (Schropp, et al. used this technique because the design of their device required the light to enter from the side that would have had a metal substrate, while use of a polymer during fabrication was prohibited by temperature requirements). In the case of Rudmann, et al., the glass substrate can be reused, but the removal of the sacrificial layer requires etching of a very thin layer from the side over a large area, which makes it undesirably slow.

Thus, there is a need in the art, for a thin film fabrication transfer process that overcomes the above disadvantages.

BRIEF DESCRIPTION OF THE DRAWINGS

The teachings of the present invention can be readily understood by considering the following detailed description in conjunction with the accompanying drawings, in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

According to embodiments of the present invention, optoelectronic devices may be fabricated on a target substrate, which is optimized for the fabrication conditions, and then transferring them to a second substrate, which is optimized for the final product (including cost). By way of example, mostly likely the second substrate would be some other inexpensive but rugged industrial polymer, such as polyethylene terephthalate (PET). In embodiments of this invention a sacrificial layer is attached to a porous target substrate, and the device layers are built on to of the sacrificial layer. The device layers may then be separated from the target substrate by removing the sacrificial layer, e.g., through the use of an etchant. The target substrate includes holes than communicate through the thickness of the target substrate so that the etchant only has to diffuse a short distance (of the order of a few microns rather than centimeters or more). Consequently, the device may be separated more quickly from the target substrate than was possible in the prior art. The materials for the sacrificial layer, etchant and target substrate may be chosen such that the target substrate is not destroyed when the sacrificial layer is removed. Thus, the target substrate may be reused in a subsequent device fabrication.

Although it may be possible to deposit the sacrificial layer directly onto such a porous substrate (e.g., by physical vapor deposition (PVD), the deposited sacrificial layer may not be flat. The resulting sacrificial layer may have some topography corresponding to the holes in the target substrate, and PV devices could not be fabricated on it. Instead of depositing the sacrificial layer directly on the substrate, the sacrificial layer may be transferred from another donor substrate (or superstrate) onto which the sacrificial layer has been first deposited, formed, or otherwise attached. The sacrificial layer can then be caused to adhere to the target substrate and subsequently or simultaneously delaminated from the donor substrate.

Figure 1:
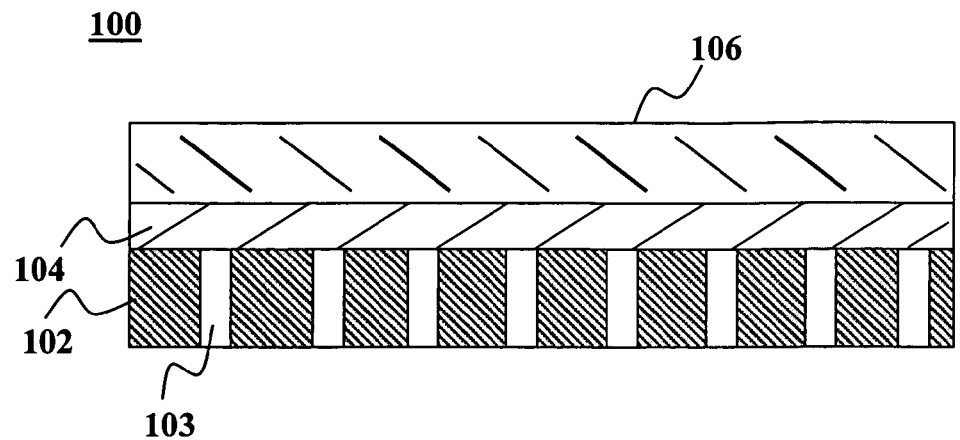
FIG. 1 is a cross-sectional schematic diagram of a partially fabricated optoelectronic device during fabrication according to an embodiment of the present invention.

By way of example, FIG. 1 depicts a partially fabricated optoelectronic device 100. As used herein, the term optoelectronic device includes both photovoltaic (PV) devices, such as solar cells and the like, as well as light emitting devices, such as light emitting diodes (including organic diodes (OLEDs), light, laser diodes and the like. The device 100 is fabricated on a reusable target substrate 102 having numerous holes 103 that communicate through the thickness of the target substrate 102. A sacrificial layer 104 is deposited, formed or attached to target substrate 102. One or more device layers 106 are then deposited, formed, or otherwise attached to the sacrificial layer 104.

By way of example, target substrate 102 may be made of a metal, such as stainless steel, that can withstand the temperatures, chemical environment and other conditions that exist during fabrication of the device layers 106. Stainless steel may be relatively expensive compared to other substrate materials such as PET. However, stainless steel is relatively resistant to heat and corrosion. Thus, stainless steel is a good choice for a reusable substrate material. The target substrate 102 may be prepared with the pores, or holes 103 of micron or submicron width spaced several microns (or tens of microns) apart. In a particular example, the substrate may be stainless steel foil approximately 50 microns thick, although thicker or thinner foils may be used. The holes 103 may be about 10 microns to 50 microns in diameter (although smaller diameters may be advantageously used) with an aspect ratio (i.e., ratio of height to diameter) up to about 10:1. As a result the target substrate 102 may retain enough structural cohesion to be used throughout the fabrication process, and to the reused many times, while allowing the dissolution or etching of the sacrificial layer 104 to take place within a few minutes or less. The holes 103 may be formed by conventional lithography and etching, laser ablation, mechanical drilling, punching, stamping and the like.

By way of example, the sacrificial layer 104 may be made of a metal or other material that can be etched or otherwise removed by a process that does not destroy the target substrate 102. Aluminum is a preferred metal for the sacrificial layer 104 because it is inexpensive, and it may be dissolved under conditions not affecting many other metals, such as stainless steel or copper. A concentrated alkali solution (e.g., sodium hydroxide (NaOH) may be used to dissolve a sacrificial layer 104 made of aluminum. Other preferred metals include copper and tungsten. Copper is easily etched in, for example, cupric chloride or ammonium hydroxide, and tungsten is readily etched by $SF_6$ gas. Chromium has several solution-based etchants, including for example potassium ferrocyanide in basic solution, or relatively dilute HCl; neither of these attacks stainless steel. In general any metal may be used for which an etchant is available that is selective with respect to the substrate. Common metal etchants are described by W. Kern and J. Vossen, Thin Film Processes, Academic Press: New York, 1978, CH V-1, which is incorporated herein by reference.

The device layers 106 may be any conventional device layers used in optoelectronic devices. Such device layers may include one or more electrodes, one or more semiconductor layers, and/or one or more light-absorbing layers. Typically the device layers include one or more light-absorbing and/or semiconducting layers disposed between two electrode layers, at least one of which transmits electromagnetic radiation (e.g., light) within a wavelength range of interest.

Figure 2A:
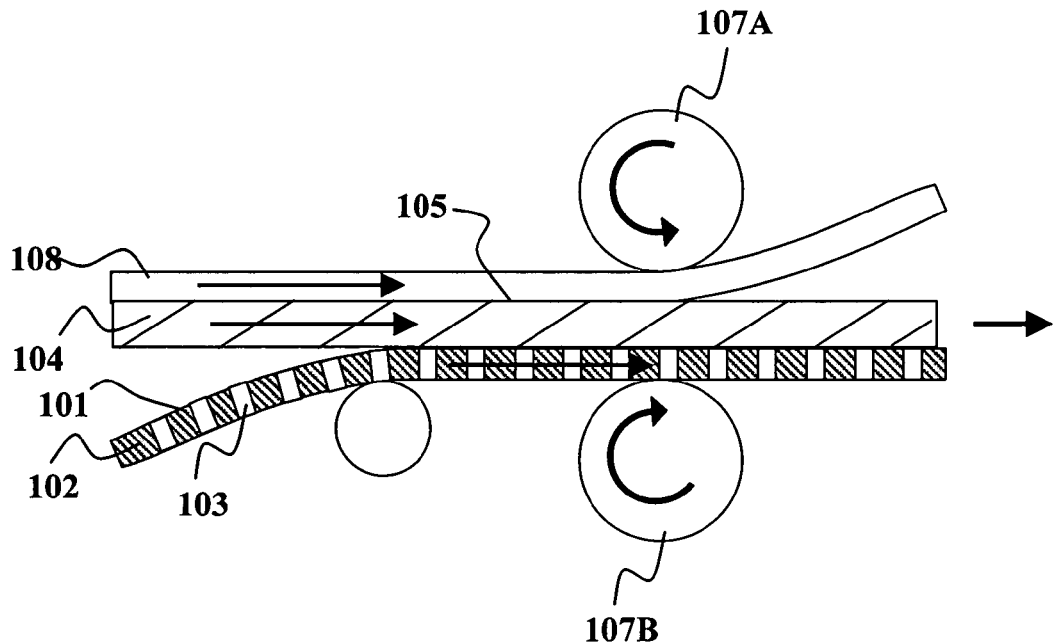
FIGS. 2A–2G are a series of schematic cross sections illustrating fabricating of optoelectronic devices according to embodiments of the present invention.

Embodiments of the invention may be implemented in high volume production schemes such as roll-to-roll processing. FIGS. 2A–2G illustrate an example of a fabrication sequence according to an embodiment of the present invention that may be implemented e.g., as a roll-to-roll process. As shown in FIG. 2A, the sacrificial layer 104 may be attached to a donor substrate (or superstrate) 108, e.g., with a temperature sensitive adhesive 105 that weakens when it is heated. The sacrificial layer 104 may be delaminated from the donor substrate 108 by heating it to a temperature sufficient to cause delamination. In some embodiments of the invention, the donor substrate 108 may be reused after the sacrificial layer 104 has been delaminated. The sacrificial layer 104 may be caused to adhere to the target substrate 102, e.g., by a heat treatment after the donor substrate 108 has been removed. Adhesion of the target substrate 102 may be done in conjunction with the delamination of the donor substrate 108.

By way of example, the sacrificial layer 104 may be a thin aluminum film, and the donor substrate 108 may be made of a polymer such as PET. The sacrificial layer 104 may be deposited on a commercially available thermal release adhesive that has been coated onto the donor substrate 108. The temperature required to release the aluminum film may be chosen to be in the range of less than about 100° C. to around 150° C. The laminate of the donor substrate 108 and sacrificial layer 104 may then brought into intimate contact with the target substrate 102 in a laminating machine, e.g., passing the combined laminate of the donor substrate 108, sacrificial layer 104 and target substrate 102 between rollers 107A, 107B, where heat is applied to the donor substrate to cause the release of the sacrificial layer 104. Immediately afterward, the sacrificial layer 104 and target substrate 102 may be heated to near the melting point of material of the sacrificial layer 104 (e.g., about 660° C. for aluminum) to cause the sacrificial layer 104 to adhere strongly to the target substrate 102. In some embodiments it may be desirable to highly polish the target substrate 102 and/or sacrificial layer 104 at the surfaces when they adhere to each other such that they tend to stick to each other even without heating or adhesives.

Some surface plasma treatment of the contact surfaces of either the sacrificial layer 104 or the target substrate 102 may also be used to cause adequate adhesion. The surface treatment could include the use of hydrogen gas or other reducing conditions so as to remove surface oxides and allow the metal atoms to bond directly. Equipment for such plasma treatment is well known in the web processing industry and can be operated under relatively low vacuum conditions (even at or near atmospheric pressure in some cases) and at very high speed. Examples are described by A. Yializis and D. A. Markgraf in "Paper, Film and Foil Converter", 1 Feb. 2001, which is incorporated herein by reference, or as sold by AST Products, Inc., Billerica, Mass., under the model number PS-3030.

It may be that a small amount of the release adhesive remains attached to the sacrificial layer 104. For example, during deposition by vacuum evaporation or sputtering there may be some interfacial intermixing even though the temperature is kept low. However, this small amount of contamination, if it causes interference in the subsequent device processing, may easily be removed by plasma ashing. Similarly, depending on the detailed nature of the interaction of the sacrificial layer 104, target substrate 102, and etching chemistry, the surface composition or morphology of the target substrate 102 may be affected by this process. However, only a very thin layer may be affected. The affected layer may be restored as needed by a brief treatment (either in vacuum or liquid).

In addition to metals, other materials may be used as the sacrificial layer 104. For example, the sacrificial layer may be made of one or more types of glass. The softening point of glasses may be adjusted by varying the glass composition over a wide range, so that a glass layer can be produced which softens (and hence bonds to the target substrate) at the desired temperature as described above. This is the principle by which glass-to-metal vacuum seals are made. For example, Corning 7056 glass melts at 718° C., while Corning 9010 melts at 646° C. A glass sacrificial layer of the desired composition can be applied to the donor substrate 108 with its release adhesive by physical vapor deposition at low temperature. The glass sacrificial layer can then be etched by an HF-based solution.

The construction of CIGS based solar cells illustrate this approach. For example, copper has a smaller coefficient of thermal expansion (CTE) than aluminum (17 ppm vs. 23 ppm). The CTE of CIGS is about 9 ppm. Thus, copper is, in this respect, more compatible with the CIGS processing than aluminum. Tungsten has an even lower CTE (~6.5 ppm), as does chromium (6.2 ppm). Composites of fiber-reinforced metals are also available with low CTEs and may be used in the sacrificial layer 104.

Figure 2B:
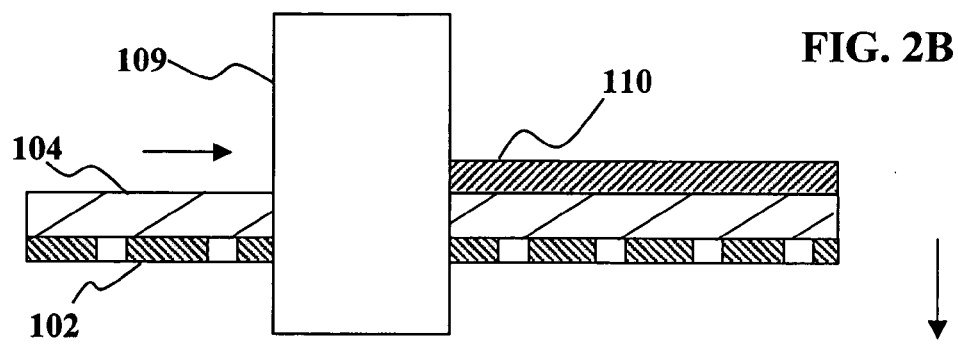
Figure 2C:
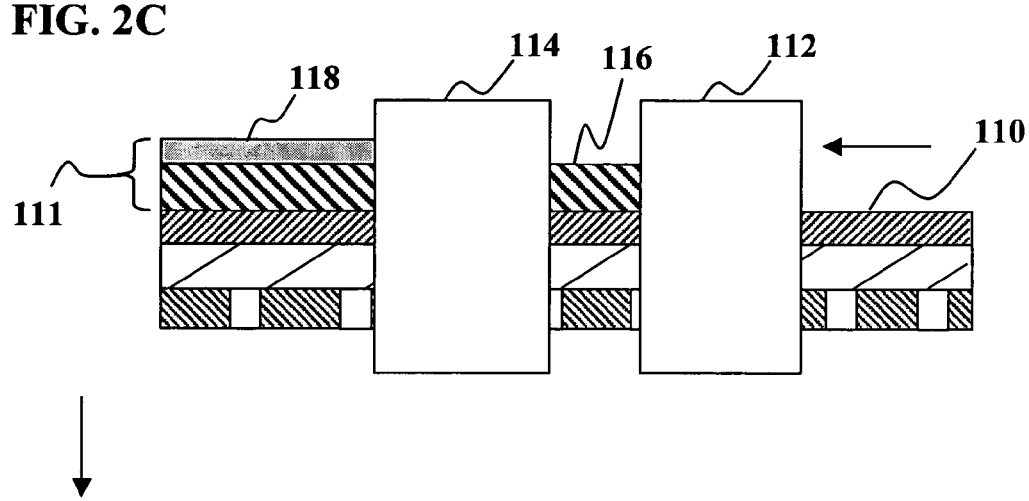
Figure 2D:
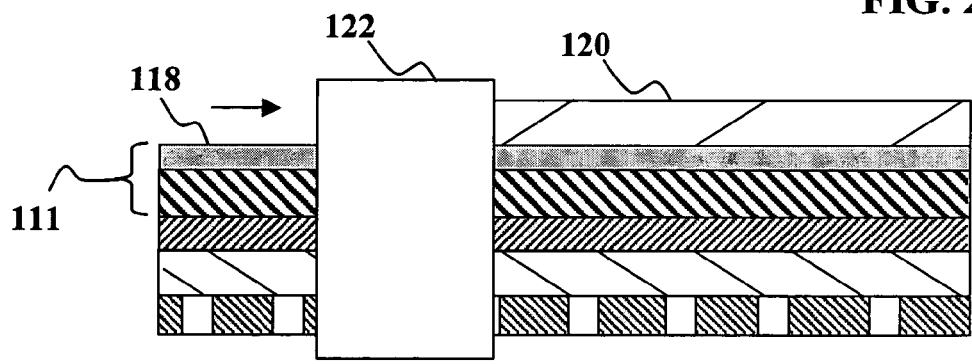

Subsequent processing can proceed as though the device layer 106 were being fabricated on the sacrificial layer 104, e.g., aluminum foil. As shown in FIGS. 2B–2D, the device layers may include active layers 111 disposed between a bottom electrode 110 and a top electrode 120. For example as shown in FIG. 2B, the target substrate 102 may pass through a bottom electrode layer deposition unit 109 that deposits, attaches or otherwise forms the bottom electrode layer 110 on the sacrificial layer 104. By way of example, a bottom electrode layer deposition unit 109 may be a PVD coating unit that deposits a layer of metal, e.g., molybdenum, as the bottom electrode layer 110.

As shown in FIG. 2C, after the bottom electrode layer 110 has been deposited on, attached to or otherwise formed on at least a portion of the sacrificial layer 104, one or more active layers 111 may be formed on the bottom electrode layer 110. The substrate 102 may carry the bottom electrode layer 110 through first and second active layer deposition units 112, 114 that respectively deposit first and second layers 116, 118. The deposition units may be sputter deposition units, PVD units, or other conventional processing units. By way of example the first active layer 116 may be a layer of CIGS and the second active layer 118 may be a layer of CdS. Alternatively, the first and/or second active layer may be deposited in the form of a liquid ink precursor that is annealed to form the final layer.

As shown in FIG. 2D, after the active layers 111 have been fabricated, the top electrode 120 may be attached so that the active layers 111 are disposed between the top electrode 120 and bottom electrode 110. A top electrode attachment unit 122 deposits, attaches or otherwise forms the top electrode on the active layers 111. It is often (though not invariably) the case that the top electrode 120 is transparent. Such a transparent electrode may be fabricated by depositing a transparent conductive oxide (TCO) on the uppermost active layer (e.g., the second active layer 118). Such a TCO, e.g., indium tin oxide (ITO), may be deposited by sputtering or other suitable techniques. As an alternative, the top electrode 120 may be include a metallic mesh (e.g., copper or aluminum) embedded in a conductive polymer, such as conductive polythiophene, conductive polyaniline, conductive polypyrroles, polyethylene-dioxythiophene doped with polystyrene sulphonic acid (PEDOT:PSS, sold under the trademark Baytron®), a derivative of PEDOT, a derivative of polyaniline, a derivative of polypyrrole. In such a case, the top electrode 120 may be fabricated in a separate a roll-to-roll process and the top electrode attachment unit 122 may attach the top electrode 120 tote active layers 111, e.g., by lamination. Examples of such a conductive electrode are disclosed in commonly-assigned U.S. patent application Ser. No. 10/403,997 entitled "IMPROVED TRANSPARENT ELECTRODE, OPTOELECTRONIC APPARATUS AND DEVICES", the disclosures of which are incorporated herein by reference.

Figure 2E:
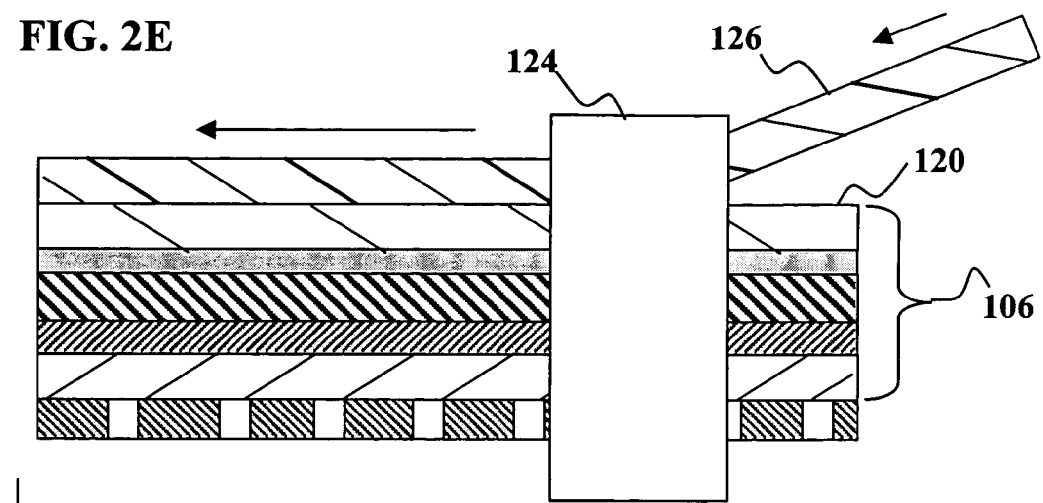
Figure 2F:
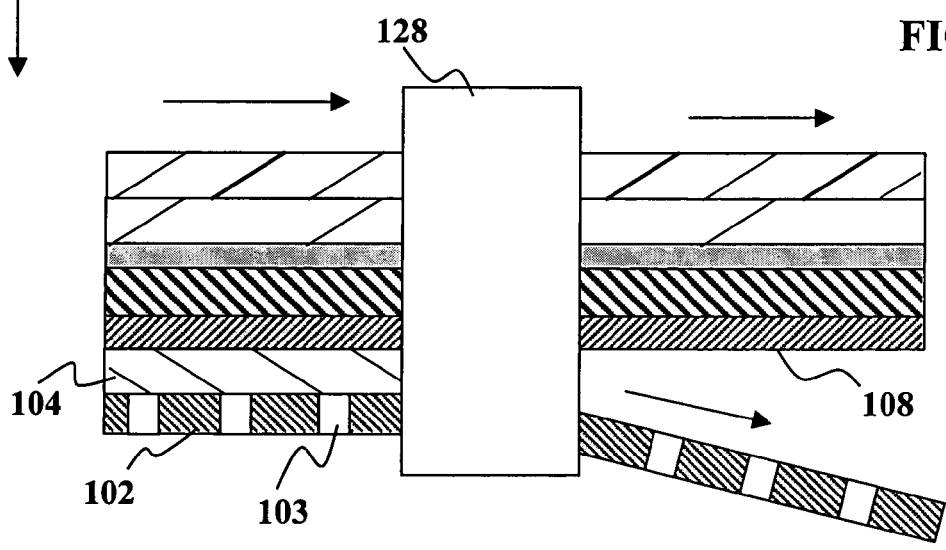
Figure 2G:
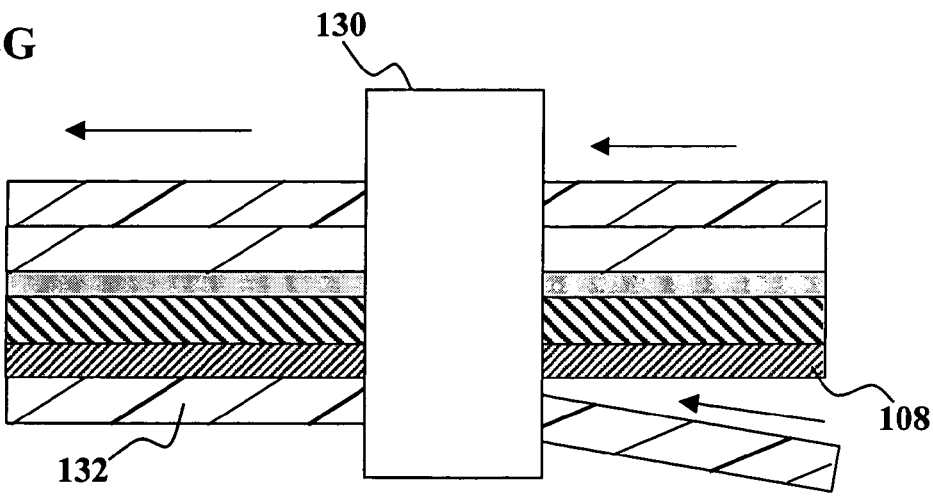

As shown in FIG. 2E, a superstrate attachment unit 124 may attach a superstrate 126 to the device layers 106 before separation of the target substrate 102. For example, after fabrication of the top electrode layer 110 is completed, a desired superstrate 126 (e.g., a polymer which may be an encapsulant or packaging material, so it is not an extra material) is laminated to the film stack. After the superstrate 126 has been attached, the sacrificial layer 104 may be etched away e.g., by passing the target substrate and accompanying layers through an etch bath 128 as shown in FIG. 2F. The device layers 106, exposed, e.g., at the bottom electrode layer 108, may then be laminated in a lamination unit 130 to a suitable protective film 132 (for example PET), which becomes the device substrate.

Figure 3:
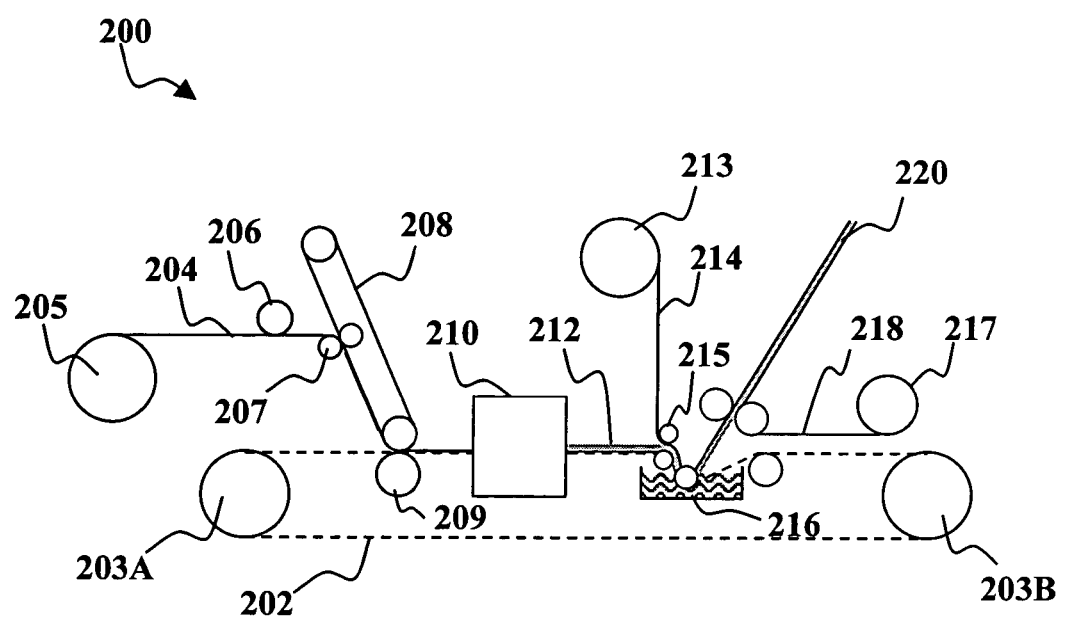
FIG. 3 is a schematic diagram illustrating a roll-to-roll processing system implementing fabrication of optoelectronic devices according to an embodiment of the present invention.

Embodiments of the invention may be implemented in a roll-to-roll processing system. FIG. 3 depicts an example of such a system 200. In the system 200 a reusable target substrate 202 e.g. of the type described above, passes between first and second rollers 203A, 203B in a continuous loop. A sacrificial layer 204 is provided in the form of a thin foil from a roll 205. An applicator roller 206 applies a heat sensitive adhesive to a surface of the sacrificial layer 204. The adhesive secures the sacrificial layer 204 to a donor substrate 208. In the example depicted in FIG. 3, the sacrificial layer and donor substrate 208 are pressed between two rollers 207.

The donor substrate 208, sacrificial layer 204 and target substrate 202 pass between heated rollers 209. The heat causes the temperature sensitive adhesive to desalinate as described above with respect to FIG. 2A while the sacrificial layer 204 attaches to the target substrate 202. The donor substrate 208 may be in the form of a "conveyor belt" type loop so that it can be reused. The target substrate 202 and sacrificial layer 204 pass through one or more device layer attachment units 210 where one or more device layers 212 are deposited, attached, or otherwise formed on the sacrificial layer 204 e.g., as described above with respect to FIG. 2B–2D.

A roll 213 supplies a sheet of superstrate material 214 (e.g., PET), which is laminated to an uppermost part of the device layers 212, e.g., between rollers 215. The target substrate 202 then passes through an etch bath 216 where the sacrificial layer 204 is etched away, e.g., as described above with respect to FIG. 2G. A roll 217 supplies device substrate material 218 (possibly PET), which is laminated to a surface of the device layers 212 exposed by the removal of the sacrificial layer 204. The resulting device sheet 220 has the device layers 212 sandwiched between layers of superstrate material 214 and substrate material 218. The device sheet 220 may be rolled into a roll or cut up into individual devices in one or more subsequent processing steps.

The chief advantage of embodiments of the invention is that, while several extra process steps may be added to prepare the substrate (which would otherwise be used as received from a vendor), all of these steps are comprised of conventional coating and laminating processes well known in the web converting industry, and capable of being carried out at very high speeds (typically several hundreds of feet per minute). As a result are very economical when practiced in high volume production, and can provide the desired substrate at a cost substantially less than the more expensive substrate materials. Based on the cost of common industry coatings, it is estimated that this process, when operated at high volume, will add a total cost comparable to that of the purchase cost of PET; thus the net result is to double the cost of PET as a final substrate.

Many variations of the embodiments described above are possible in a web-based or roll-to-roll processing environment. For example, the target substrate 102 may be a continuous sheet in the form of a closed loop that may be reused through several cycles of device fabrication. Such a closed loop substrate may serve in the manner of a conveyor belt for device fabrication. The device layers formed on the sacrificial layer attached to the target substrate "conveyor belt" in a continuous fashion and separated from the belt once device fabrication is sufficiently complete. Since the belt need only be long enough to accommodate the fabrication sequence, a relatively short length of target substrate material may be used to fabricate sheets of devices of almost unlimited length.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for fabricating optoelectronic devices, comprising the steps of:
    depositing, forming or attaching a sacrificial layer to a target substrate, the target substrate having a plurality of holes formed therethrough, wherein the sacrificial layer covers the holes without filling the holes;
    forming one or more device layers on the sacrificial layer; and
    exposing the sacrificial layer to an etchant through the holes in the target substrate to detach the target substrate from the sacrificial layer without destroying the target substrate.

2. A method for fabricating optoelectronic devices, comprising the steps of:
    depositing, forming or attaching a sacrificial layer to a target substrate, the target substrate having a plurality of holes formed therethrough;
    forming one or more device layers on the sacrificial layer; and
    exposing the sacrificial layer to an etchant through the holes in the target to detach the target substrate from the sacrificial layer without destroying the target substrate, wherein depositing, forming or attaching the sacrificial layer to the target substrate includes adhering the sacrificial layer to a donor substrate (or superstrate); detaching the sacrificial layer from the donor substrate (or superstrate) and attaching the sacrificial layer to the target substrate.

3. The method of claim 2, wherein adhering the sacrificial layer to a donor substrate (or superstrate) includes the use of a thermally sensitive adhesive that delaminates the sacrificial layer from the donor substrate (or superstrate) when heated to a sufficient temperature.

4. The method of claim 3, further comprising the step of heating the thermally sensitive adhesive to a temperature sufficient to delaminate the sacrificial layer from the donor substrate (or superstrate).

5. The method of claim 4 wherein the donor substrate (or superstrate) is a sheet of material in the form of a continuous loop.

6. A method for fabricating optoelectronic devices, comprising the steps of:
    depositing, forming or attaching a sacrificial layer to a target substrate, the target substrate having a plurality of holes formed therethrough;
    forming one or more device layers on the sacrificial layer;
    exposing the sacrificial layer to an etchant through the holes in the target substrate to detach the target substrate from the sacrificial layer without destroying the target substrate; and attaching the one or more device layers to a second substrate.

7. The method of claim 6 wherein at least a portion of the one or more device layers is attached to the second substrate, the portion of the device layers being between the first and second substrates, before detaching the target substrate from the sacrificial layer.

8. The method of claim 1, 2, or 6 wherein the sacrificial layer includes one or more metals.

9. The apparatus of claim 8 wherein the one or metals includes aluminum, copper, tungsten or chromium.

10. The method of claim 9 wherein the one or more metals include aluminum and the etchant includes sodium hydroxide.

11. The method of claim 10 wherein the etchant includes a liquid solution of sodium hydroxide.

12. The method of claim 9 wherein the one or more metals includes copper and the etchant includes cupric chloride or ammonium hydroxide.

13. The method of claim 9 wherein the one or more metals include tungsten and the etchant includes $SF_6$ gas.

14. The method of claim 9 wherein the one or more metals includes chromium and the etchant includes potassium ferrocyanide in basic solution, or dilute hydrochloric acid.

15. A method for fabricating optoelectronic devices, comprising the steps of:

depositing, forming or attaching a sacrificial layer to a target substrate, the target substrate having a plurality of holes formed therethrough, wherein attaching the sacrificial layer to the target substrate includes polishing the target substrate and/or sacrificial layer at surfaces where they adhere to each other such that they tend to stick to each other;

forming one or more device layers on the sacrificial layer; and exposing the sacrificial layer to an etchant through the holes in the target substrate to detach the target substrate from the sacrificial layer without destroying the target substrate.

16. A method for fabricating optoelectronic devices, comprising the steps of:

depositing, forming or attaching a sacrificial layer to a target substrate, the target substrate having a plurality of holes formed therethrough, wherein attaching the sacrificial layer to the target substrate includes bringing the sacrificial layer into intimate contact with the target substrate and heating the target substrate and/or sacrificial layer to a temperature near the melting point of the material of the sacrificial layer;

forming one or more device layers on the sacrificial layer; and exposing the sacrificial layer to an etchant through the holes in the target substrate to detach the target substrate from the sacrificial layer without destroying the target substrate.

17. A method for fabricating optoelectronic devices, comprising the steps of:

depositing, forming or attaching a sacrificial layer to a target substrate, the target substrate having a plurality of holes formed therethrough, wherein attaching the sacrificial layer to the target substrate includes treating the surface of the sacrificial layer and/or the target substrate with a reducing plasma; forming one or more device layers on the sacrificial layer; and exposing the sacrificial layer to an etchant through the holes in the target substrate to detach the target substrate from the sacrificial layer without destroying the target substrate.

18. A method for fabricating optoelectronic devices, comprising the steps of:

depositing, forming or attaching a sacrificial layer to a target substrate, the target substrate having a plurality of holes formed therethrough;

forming one or more device layers on the sacrificial layer;

exposing the sacrificial layer to an etchant through the holes in the target substrate to detach the target substrate from the sacrificial layer without destroying the target substrate; and reusing the target substrate in a subsequent optoelectronic device fabrication process.

19. The method of claim 18 wherein the subsequent device fabrication process includes the steps of depositing, forming or attaching a sacrificial layer to the target substrate; and forming one or more device layers on the sacrificial layer.

20. The method of claim 18 wherein the optoelectronic device is a photovoltaic cell or module.

21. A method for fabricating optoelectronic devices, comprising the steps of:

depositing, forming or attaching a sacrificial layer to a target substrate, the target substrate having a plurality of holes formed therethrough, wherein the target substrate is a continuous sheet in the form of a closed loop;

forming one or more device layers on the sacrificial layer;

exposing the sacrificial layer to an etchant through the holes in the target substrate to detach the target substrate from the sacrificial layer without destroying the target substrate.

22. A method for fabricating optoelectronic devices, comprising the steps of:

depositing, forming or attaching a sacrificial layer to a target substrate, the target substrate having a plurality of holes formed therethrough;

forming one or more device layers on the sacrificial layer;

exposing the sacrificial layer to an etchant through the holes in the target substrate to detach the target substrate from the sacrificial layer without destroying the target substrate, wherein the step of the method are implemented in a roll-to-roll processing system.

23. A method for fabricating optoelectronic devices, comprising the steps of:

depositing, forming or attaching a sacrificial layer to a target substrate, the target substrate having a plurality of holes formed therethrough;

forming one or more device layers on the sacrificial layer;

exposing the sacrificial layer to an etchant through the holes in the target substrate to detach the target substrate from the sacrificial layer without destroying the target substrate, wherein the optoelectronic device is a photovoltaic cell or module.

24. A method for fabricating optoelectronic devices, comprising the steps of:

depositing, forming or attaching a sacrificial layer to a target substrate, the target substrate having a plurality of holes formed therethrough, wherein the sacrificial layer includes aluminum;

forming one or more device layers on the sacrificial layer;

exposing the sacrificial layer to an etchant through the holes in the target substrate to detach the target substrate from the sacrificial layer without destroying the target substrate, wherein the etchant includes sodium hydroxide.

25. The method of claim 24 wherein the etchant includes a liquid solution of sodium hydroxide.

26. A method for fabricating optoelectronic devices, comprising the steps of:

depositing, forming or attaching a sacrificial layer to a target substrate, the target substrate having a plurality of holes formed therethrough, wherein the sacrificial layer includes copper;

forming one or more device layers on the sacrificial layer;

exposing the sacrificial layer to an etchant through the holes in the target substrate to detach the target substrate from the sacrificial layer without destroying the target substrate or the sacrificial layer, wherein the etchant includes cupric chloride or ammonium hydroxide.

* * * * *